(12) United States Patent
Chuang et al.

(10) Patent No.: US 11,121,141 B2
(45) Date of Patent: *Sep. 14, 2021

(54) SEMICONDUCTOR STRUCTURE AND METHOD FOR FORMING THE SAME

(71) Applicant: Taiwan Semiconductor Manufacturing Company, Ltd., Hsinchu (TW)

(72) Inventors: Chiang-Ming Chuang, Changhua (TW); Chien-Hsuan Liu, Tainan (TW); Chih-Ming Lee, Tainan (TW); Kun-Tsang Chuang, Miaoli (TW); Hung-Che Liao, Tainan (TW); Hsin-Chi Chen, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 115 days.

This patent is subject to a terminal disclaimer.

(21) Appl. No.: 16/404,454

(22) Filed: May 6, 2019

(65) Prior Publication Data

US 2019/0259771 A1   Aug. 22, 2019

Related U.S. Application Data

(60) Continuation of application No. 15/707,554, filed on Sep. 18, 2017, now Pat. No. 10,283,510, which is a
(Continued)

(51) Int. Cl.
*H01L 27/115* (2017.01)
*H01L 27/11521* (2017.01)
(Continued)

(52) U.S. Cl.
CPC ...... *H01L 27/11521* (2013.01); *H01L 23/535* (2013.01); *H01L 27/11548* (2013.01); *H01L 27/11575* (2013.01); *H01L 29/0649* (2013.01); *H01L 29/42328* (2013.01); *G11C 16/0408* (2013.01); *H01L 27/11519* (2013.01); *H01L 27/11565* (2013.01)

(58) Field of Classification Search
None
See application file for complete search history.

(56) References Cited

U.S. PATENT DOCUMENTS 5,457,335 A   10/1995   Kuroda et al.
5,479,036 A   12/1995   Hong
(Continued)

FOREIGN PATENT DOCUMENTS

CN   101055877 A   10/2007
JP   4992722 B2    8/2012
(Continued)

*Primary Examiner* — Michael Lebentritt
(74) *Attorney, Agent, or Firm* — Slater Matsil, LLP

(57) ABSTRACT

A semiconductor structure includes a semiconductor substrate, at least one raised dummy feature, at least one memory cell, and at least one word line. The raised dummy feature is present on the semiconductor substrate and defines a cell region on the semiconductor substrate. The memory cell is present on the cell region. The word line is present adjacent to the memory cell.

20 Claims, 16 Drawing Sheets

Related U.S. Application Data division of application No. 15/158,517, filed on May 18, 2016, now Pat. No. 9,768,182.

(60) Provisional application No. 62/243,920, filed on Oct. 20, 2015.

(51) Int. Cl.
| | |
|---|---|
| *H01L 23/535* | (2006.01) |
| *H01L 29/06* | (2006.01) |
| *H01L 29/423* | (2006.01) |
| *H01L 27/11548* | (2017.01) |
| *H01L 27/11575* | (2017.01) |
| *G11C 16/04* | (2006.01) |
| *H01L 27/11519* | (2017.01) |
| *H01L 27/11565* | (2017.01) |

(56) References Cited

U.S. PATENT DOCUMENTS

| | | |
|---|---|---|
| 5,538,952 A | 7/1996 | Mukerji et al. |
| 5,734,607 A | 3/1998 | Sung et al. |
| 5,773,857 A | 6/1998 | Ura |
| 5,945,702 A | 8/1999 | Nakanishi |
| 5,946,230 A * | 8/1999 | Shimizu ............. H01L 27/105 257/314 |
| 5,994,733 A * | 11/1999 | Nishioka ............ H01L 27/115 257/315 |
| 6,353,242 B1 * | 3/2002 | Watanabe ........ G11C 16/0483 257/208 |
| 6,376,884 B1 | 4/2002 | Hotta |
| 6,420,744 B1 | 7/2002 | Kim et al. |
| 6,590,254 B2 | 7/2003 | Tanaka |
| 6,740,940 B2 | 5/2004 | Kim et al. |
| 6,853,029 B2 | 2/2005 | Ichige et al. |
| 6,901,006 B1 | 5/2005 | Kobayashi et al. |
| 7,078,762 B2 | 7/2006 | Ishii et al. |
| 7,859,045 B2 | 12/2010 | Nakagawa et al. |
| 7,875,927 B2 | 1/2011 | Inoue |
| 7,994,565 B2 | 8/2011 | Higashitani |
| 8,273,610 B2 | 9/2012 | Or-Bach et al. |
| 8,823,075 B2 | 9/2014 | Purayath et al. |
| 8,877,627 B2 | 11/2014 | Dunga et al. |
| 9,000,557 B2 | 4/2015 | Or-Bach et al. |
| 2004/0058496 A1 | 3/2004 | Lee |
| 2005/0041477 A1 | 2/2005 | Lee et al. |
| 2005/0139905 A1 | 6/2005 | Jung |
| 2007/0241386 A1 | 10/2007 | Wang et al. |
| 2008/0106934 A1 | 5/2008 | Lee et al. |
| 2008/0237586 A1 | 10/2008 | Sun et al. |
| 2008/0283900 A1 | 11/2008 | Nakagawa et al. |
| 2010/0052031 A1 | 3/2010 | Lee |
| 2012/0049148 A1 | 3/2012 | Fukano |
| 2015/0084111 A1 | 3/2015 | Wu et al. |

FOREIGN PATENT DOCUMENTS

| | | |
|---|---|---|
| KR | 1020000002760 A | 1/2000 |
| KR | 1020010046890 A | 6/2001 |
| KR | 20020012298 | 2/2002 |
| KR | 1020050021616 A | 3/2005 |
| WO | 0101469 A2 | 1/2001 |

* cited by examiner

SEMICONDUCTOR STRUCTURE AND METHOD FOR FORMING THE SAME

PRIORITY CLAIM AND CROSS-REFERENCE

This application is a continuation of U.S. patent application Ser. No. 15/707,554, filed on Sep. 18, 2017, and entitled "Semiconductor Structure and Method for Forming the Same," which is a divisional of U.S. patent application Ser. No. 15/158,517, filed on May 18, 2016, now U.S. Pat. No. 9,768,182 issued on Sep. 19, 2017, and entitled "Semiconductor Structure and Method for Forming the Same" which claims priority to U.S. Provisional Patent Application No. 62/243,920 filed Oct. 20, 2015, and entitled "Fosses Structure to Protect Array Completeness," which applications are incorporated herein by reference.

BACKGROUND

Devices made from semiconductor materials are used to create memory circuits in electrical components and systems. Memory circuits are the backbone of such devices as data and instruction sets are stored therein. Maximizing the number of memory elements per unit area on such circuits minimizes their cost and thus is impetus in the designing of such circuits.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
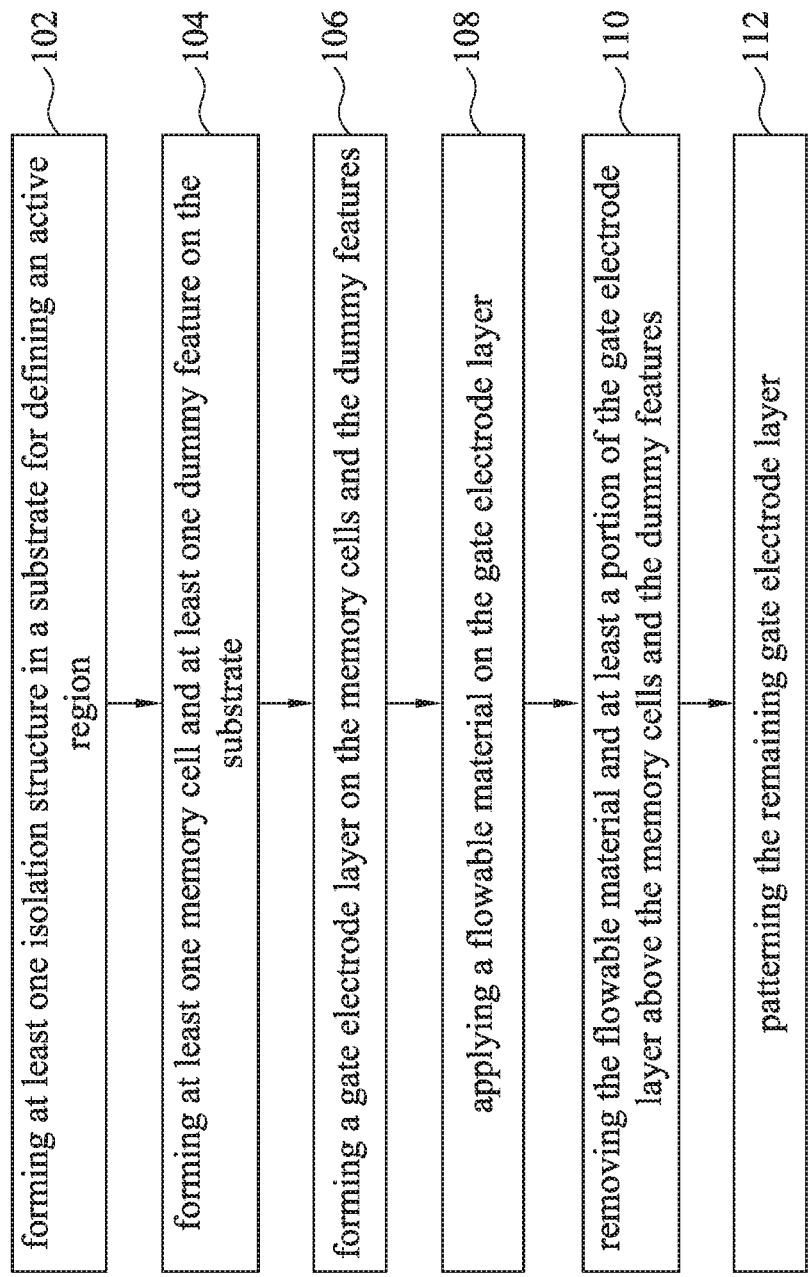
FIG. 1 is a flow chart of a method for forming a semiconductor structure according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flow chart of a method 100 for forming a semiconductor structure according to some embodiments of the present disclosure. FIGS. 2A-2E and FIGS. 2G-2L are cross-sectional views of the semiconductor structure 200 at plural intermediate stages of the method 100 for forming the semiconductor structure 200 in accordance with some embodiments of the present disclosure. It is understood that additional steps may be implemented before, during, or after the method 100, and some of the steps described may be replaced or eliminated for other embodiments of the method 100. The semiconductor structure 200 and the method 100 making the same are collectively described with reference to various figures.

Figure 2A:
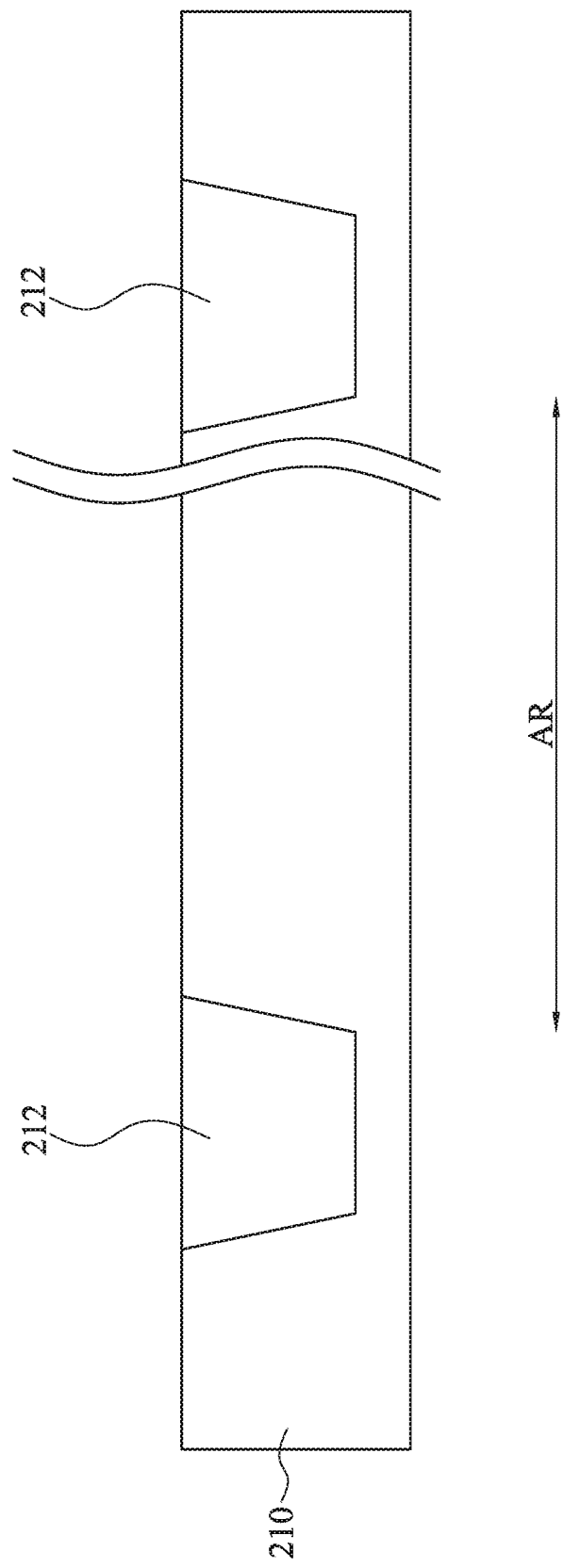
FIGS. 2A-2E and FIGS. 2G-2L are cross-sectional views of a semiconductor structure at plural intermediate stages of the method for forming the semiconductor structure in accordance with some embodiments of the present disclosure.

Referring to FIG. 1 and FIG. 2A, the method 100 begins at step 102 by forming at least one isolation structure 212 in a substrate 210. In some embodiments, the substrate 210 is a silicon substrate. In some other embodiments, the substrate 210 can be made of other materials, including silicon, carbon, germanium, gallium, arsenic, nitrogen, aluminum, indium, and/or phosphorus. The substrate 210 may also be a bulk substrate or have a semiconductor-on-insulator (SOI) structure.

The isolation structure 212, such as shallow trench isolation (STI) or local oxidation of silicon (LOCOS), may be disposed in the substrate 210 to define and electrically isolate at least one active region AR. In some embodiments, formation of an STI feature may include dry etching a trench in the substrate 210 and filling the trench with at least one insulating material, such as silicon oxide, silicon nitride, or silicon oxynitride. The filled trench may have a multilayer structure, such as a thermal oxide liner filled with silicon nitride or silicon oxide. In some embodiments, the STI structure may be created using a processing sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with chemical vapor deposition (CVD) oxide, using chemical mechanical polishing (CMP) processing to etch back and planarize, and using a nitride stripping process to remove the silicon nitride.

In the cases wherein the substrate 210 has a semiconductor-on-insulator (SOI) structure, the trench may be deep enough to reach the buried oxide layer, so that the subsequently formed devices are enclosed in dielectric materials, and thus the leakage current is reduced.

The method 100 proceeds to step 104 by forming at least one memory cell and at least one dummy feature on the substrate 210. FIGS. 2B-2F illustrate formation of the memory cells MC and the dummy features DF. FIG. 2F is a schematic top view of the semiconductor structure 200 of FIG. 2E.

Figure 2B:
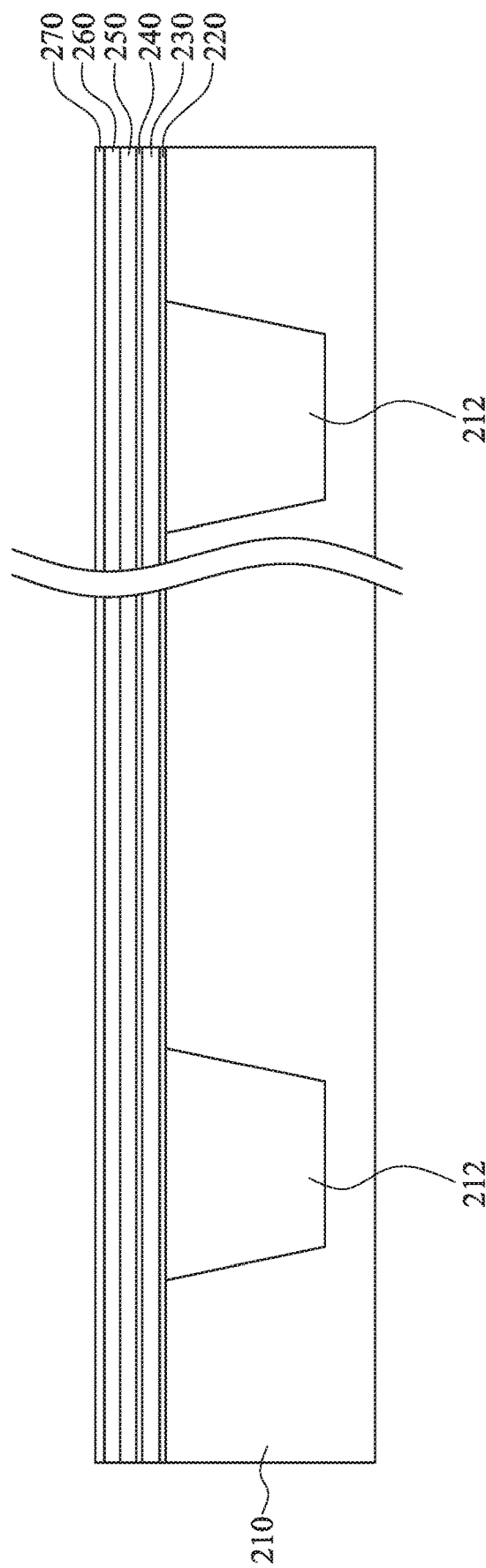

Referring to FIG. 2B, a tunneling layer 220, a floating gate layer 230, a blocking layer 240, a control gate layer 250, a first capping layer 260, and a second capping layer 270 are subsequently formed on the substrate 210.

The tunneling layer 220 may be an oxide layer formed by any oxidation process, such as wet or dry thermal oxidation or an in-situ steam generation (ISSG) process, in an ambient comprising $H_2O$, NO, or a combination thereof, or by a chemical vapor deposition (CVD) technique using tetra-ethyl-ortho-silicate (TEOS) and oxygen as precursors. The tunneling layer 220 may also include at least one high-k dielectric material, such as hafnium dioxide ($HfO_2$), silicon nitride, silicon oxynitride, or the like. In some embodiments, the tunneling layer 220 is less than about 200 angstroms in thickness. It should be appreciated, however, that the dimensions cited in the specification are examples, and these dimensions will change with the scaling of integrated circuits.

The floating gate layer 230, also sometimes referred to as a storage layer, is formed on the tunneling layer 220. In some embodiments, the floating gate layer 230 is a dielectric layer with a high trap density, which may include nitride. Charges are stored in the floating gate layer 230 around traps. Alternatively, the floating gate layer 230 includes at least one conductive material, such as polysilicon, amorphous silicon, or the like.

The blocking layer 240 may include a low-leakage dielectric material, such as $HfO_2$, or other dielectric materials, such as silicon oxide. The blocking layer 240 may be formed by, for example, physical vapor deposition (PVD), atomic layer chemical vapor deposition (ALCVD), metal-organic CVD (MOCVD), or the like. The effective oxide thickness of the blocking layer 240 may be less than about 170 angstroms.

In some embodiments, the control gate layer 250 includes doped polysilicon. For example, the control gate layer 250 may be heavily doped with phosphorus, arsenic, or boron. The method for forming the control gate layer 250 may include, for example, PVD. The first capping layer 260 is a dielectric layer and may be made of a dielectric material, such as oxide, nitride, oxynitride, or combinations thereof. The second capping layer 270 is a dielectric layer and may be made of silicon nitride.

Figure 2C:
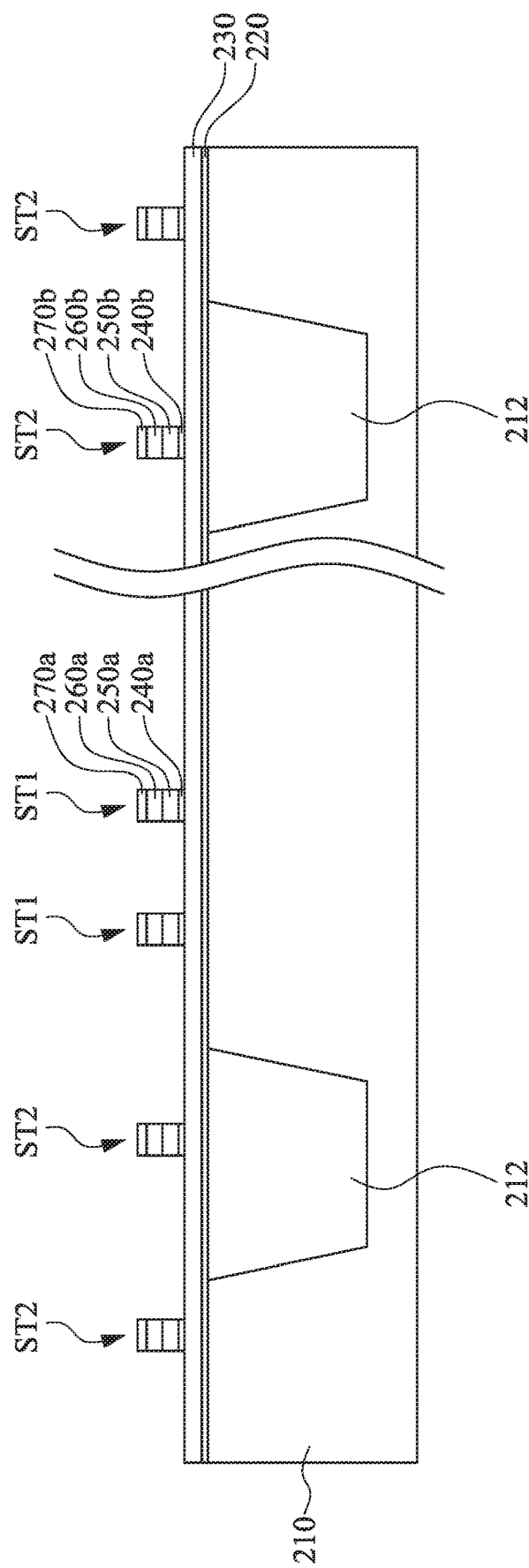

The blocking layer 240, the control gate layer 250, the first capping layer 260, and the second capping layer 270 are then patterned. Reference is made to FIG. 2C. FIG. 2C illustrates a resulting structure after the patterning the structure shown in FIG. 2B. The blocking layers 240a, the control gate layers 250a, the first capping layers 260a, and the second capping layers 270a are formed and stacked as the stack ST1, and the blocking layers 240b, the control gate layers 250b, the first capping layers 260b, and the second capping layers 270b are formed and stacked as the stack ST2. Herein, though it is not shown, the stacks ST 2 surround the stacks ST1. The stacks ST1 and ST2 are respectively portions of memory cells and dummy features formed in subsequent processes.

Figure 2D:
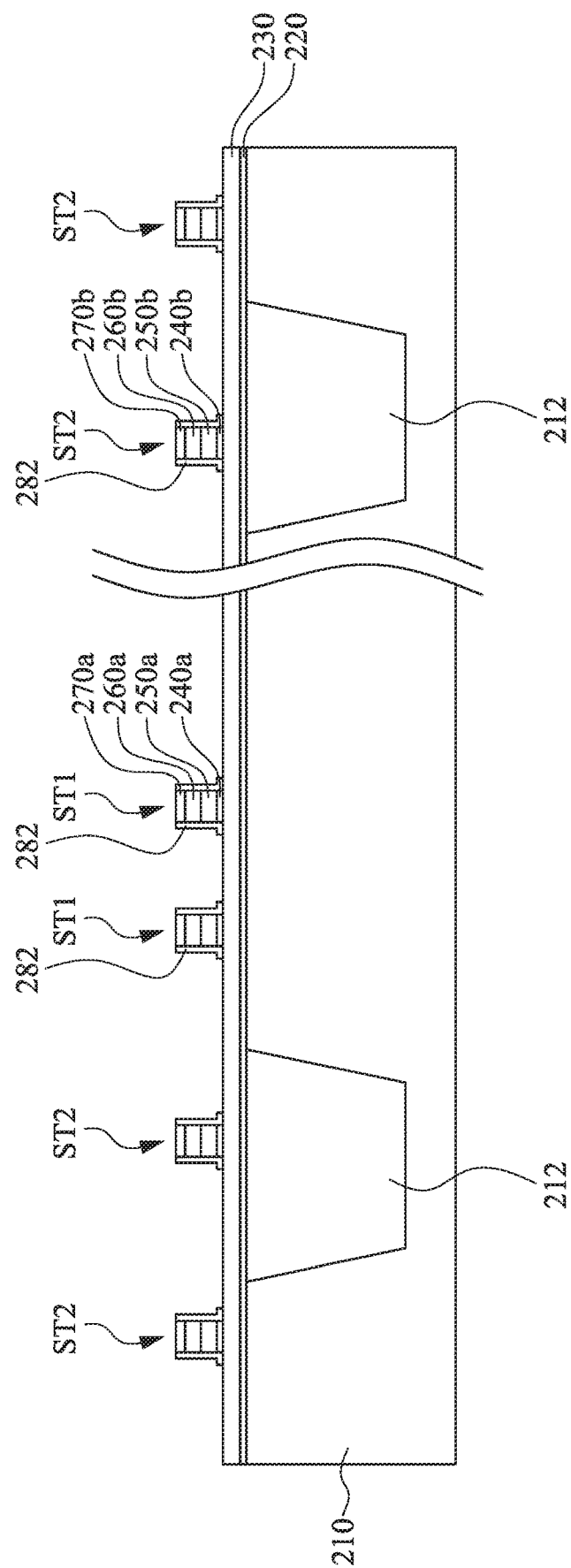

Reference is made to FIG. 2D. Plural first sidewall spacers 282 are formed on sidewalls of the stacks ST1 and the stacks ST2. The first sidewall spacers 282 may be made of nitride, silicon nitride, and/or other dielectric materials.

Figure 2E:
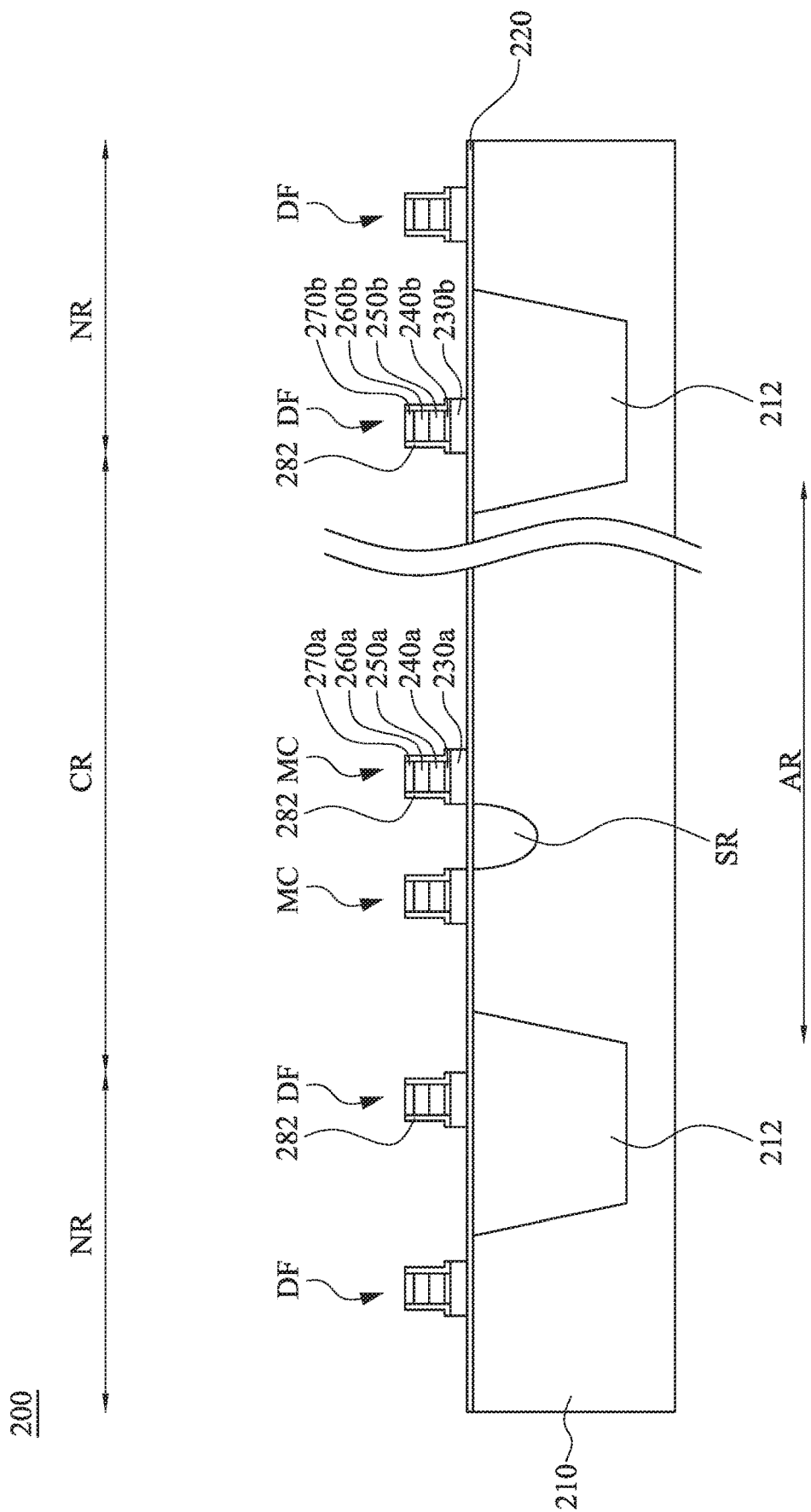
Figure 2F:
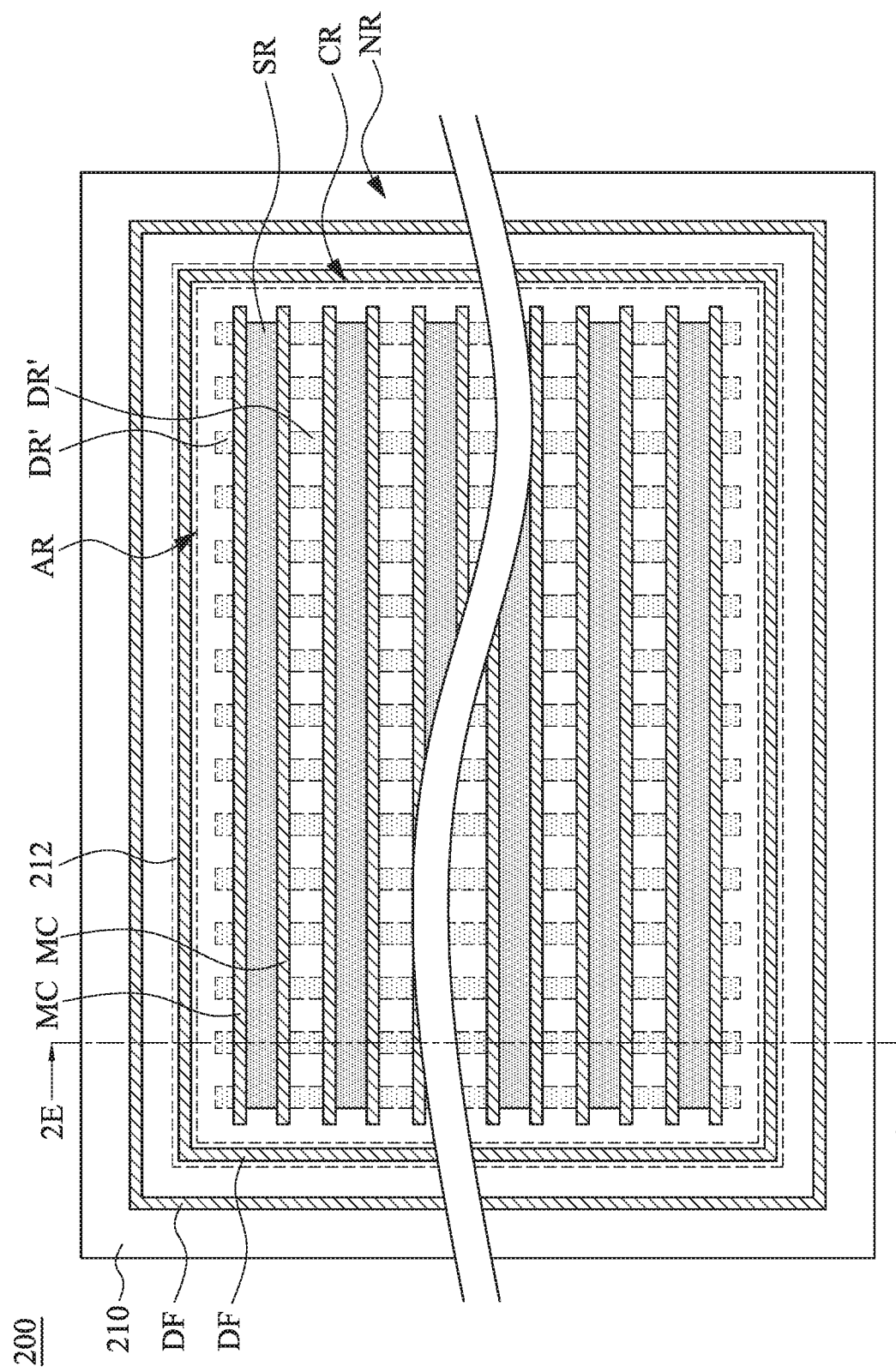
FIG. 2F is a schematic top view of the semiconductor structure of FIG. 2E.

Reference is made to FIG. 2E. The floating gate layer 230 (referring to FIG. 2D) is patterned to form the floating gate layers 230a and 230b. Herein, a dry etching process may be performed. The second capping layers 270a, the second capping layers 270b, and the first sidewall spacers 282 are used as masks to prevent the control gate layers 250a and the control gate layers 250b from etching away.

After the patterning process, at least one memory cell MC and at least one dummy feature DF are formed on the substrate 210. As shown in FIG. 2E, each of the memory cells MC includes a stack of the floating gate layer 230a, the blocking layer 240a, the control gate layer 250a, the first capping layer 260a, and the second capping layer 270a from bottom to top. Each of the dummy features DF includes a stack of the floating gate layer 230b, the blocking layer 240b, the control gate layer 250b, the first capping layer 260b, and the second capping layer 270b from bottom to top.

After the formation of the memory cells MC and the dummy features DF, at least one source region SR is formed in the substrate 210 between at least one pair of the memory cells MC. In some embodiments, the source region SR may be formed by one or more ion implantation processes. Alternatively, in some other embodiments, the source region SR may be portions of an epitaxy layer. Though it is not shown, in some embodiments, the source region SR may extend beneath edge portions of the floating gate layers 230a.

Reference is made to FIG. 2E and FIG. 2F. FIG. 2F is a top view of the semiconductor structure 200 according to some embodiments of the present disclosure, while FIG. 2E is the cross-sectional view taken along line 2E-2E of FIG. 2F. In FIG. 2F, the isolation structures 212 are depicted as the region indicated by the dashed lines, and the memory cells MC and the dummy features DF are depicted as hatched patterns.

The dummy features DF surround the memory cells MC. For clear illustration, herein, at least one of the dummy features DF defines a cell region CR and a non-cell region NR of the substrate 210. The plural memory cells MC are disposed on the cell region CR for a flash memory device. Other non-memory devices, such as core devices, may be formed on the non-cell region NR. In the present embodiments, the dummy features DF encircle the memory cells MC. To be specific, the projections of the dummy features DF on the substrate 210 form closed graphs, such as rectangles, enclosing the projections of the memory cells MC on the substrate 210. In some embodiments, the closed graphs may be circles, squares, or trapezoids, other than the rectangles shown in FIG. 2F. Though it is not shown, in some embodiments, the projections of the dummy features DF on the substrate 210 may not form the closed graphs, but the memory cells MC may be partially surrounded by the dummy features DF.

Herein, the memory cells MC are surrounded by two dummy features DF, one of the dummy features DF is formed on the isolation structure 212, and the other of the dummy features DF is formed away from the isolation structure 212. However, the number and locations of the dummy features DF should not limit various embodiments of the present disclosure. In some embodiments, the memory cells MC are surrounded by one dummy feature DF. In some embodiments, the dummy features DF may be all formed on the isolation structure 212 or all formed away from the isolation structure 212 and out of the active region AR.

In FIG. 2F, there are plural predetermined regions DR' adjacent to the memory cells MC, depicted as the regions indicated by dashed lines and filled with dotted patterned. The predetermined regions DR' indicates positions of plural drain regions which are to be formed in the subsequently processes. The configuration of the common source regions SR illustrated herein is not intended to limit various embodiments of the present disclosure. In some embodiments, at least one common drain region may be disposed between at least one pair of the memory cells, and source regions are disposed respectively adjacent to the memory cells.

Figure 2G:
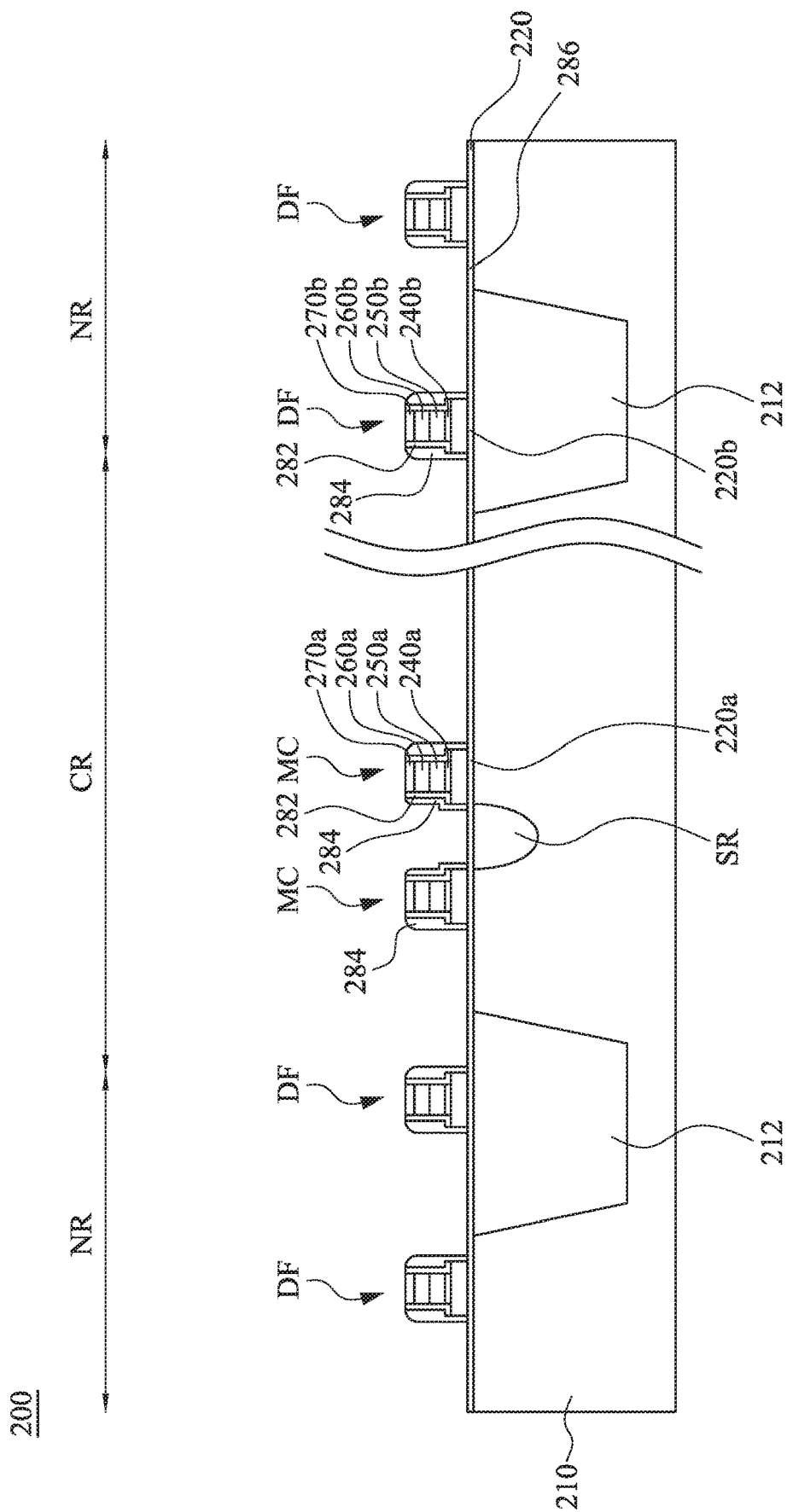

Referring to FIG. 2G, following ion implantation, plural second sidewall spacers 284 are formed adjacent to the first sidewall spacers 282 on the sidewalls of the memory cells MC and the dummy features DF. The second sidewall spacers 284 may be made of oxide, the combination of oxide, nitride and oxide (ONO), and/or other dielectric materials.

Herein, the second sidewall spacers 284 on the opposite sidewalls of the dummy features DF have the same structure, while the second sidewall spacers 284 on the opposite sidewalls of the memory cells MC have different structures respectively. For example, the second sidewall spacers 284 adjacent to the dummy features DF and one of the second sidewall spacers 284 adjacent to the memory cells MC have a thicker thickness adjacent to the controlling gate layer 250a and 250b and a thinner thickness adjacent to the floating gate layer 230a and 230b respectively. Comparatively, the other one of the second sidewall spacers 284 adjacent to the memory cells MC has a more uniform thickness than that of the second sidewall spacers 284 adjacent to the dummy features DF.

In some other embodiments, though it is not depicted, the second sidewall spacers 284 adjacent to the dummy features DF may be the same as the second sidewall spacers 284 adjacent to the memory cells MC respectively. Alternatively, the second sidewall spacers 284 adjacent to the dummy features DF may have different structures from any one of the second sidewall spacers 284 adjacent to the memory cells MC.

Figure 2H:
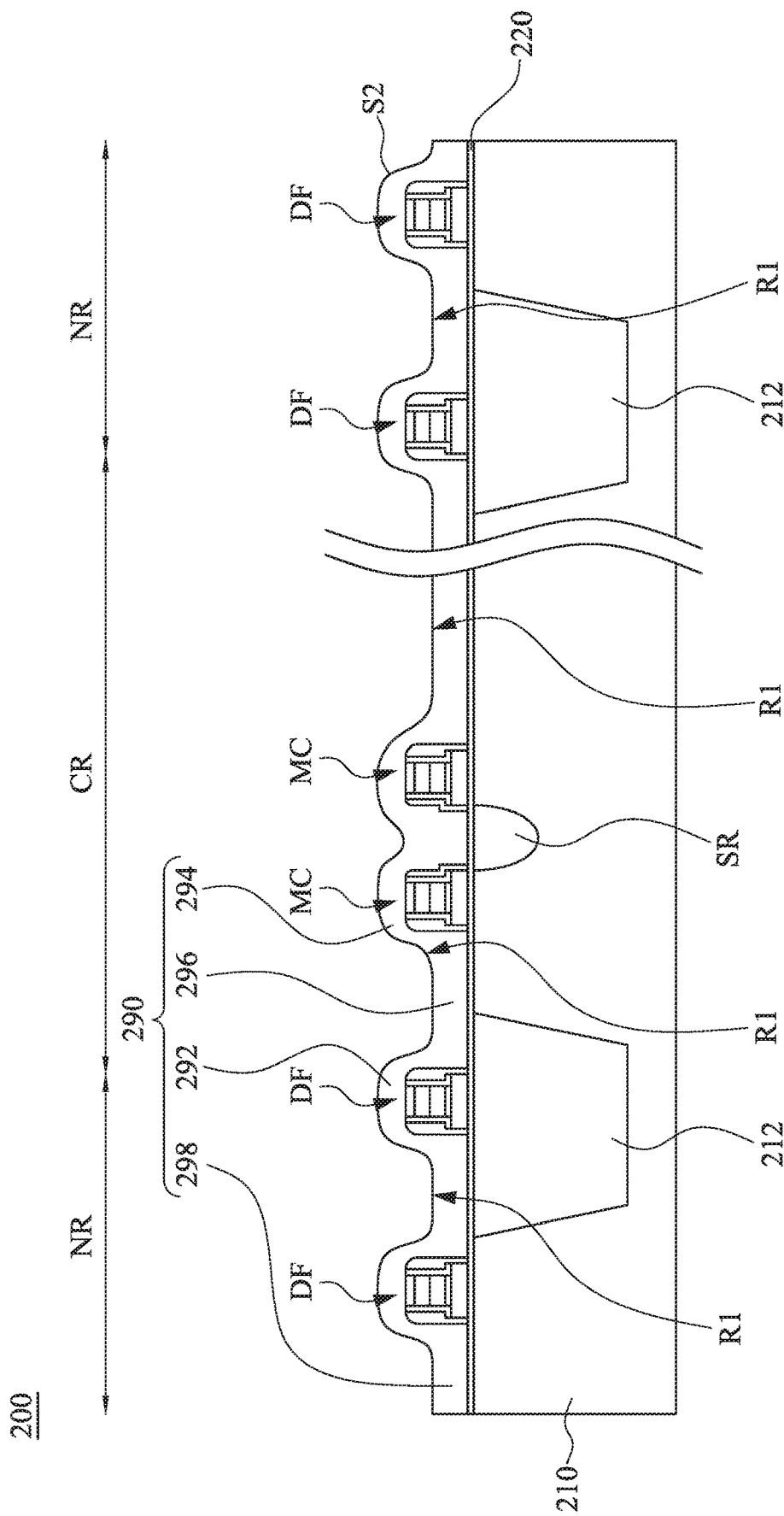

Referring to FIG. 1 and FIG. 2H, the method 100 proceeds to step 106 by forming a gate electrode layer 290 on the memory cells MC and the dummy features DF. Referring to FIG. 2H, the gate electrode layer 290 is formed over the substrate 210 and overlying the memory cells MC and the dummy features DF. The gate electrode layer 290 may be made of poly silicon. Alternatively, the gate electrode layer 290 may include doped polysilicon, amorphous silicon, other suitable conductive materials, or combinations thereof. The gate electrode layer 290 may be formed by CVD, plasma-enhanced chemical vapor deposition (PECVD), LPCVD, or other proper processes.

Herein, the gate electrode layer 290 includes upper portions 292, upper portions 294, recessed portions 296, and at least one recessed portion 298. The upper portions 292 are disposed on the dummy features DF. The upper portions 294 are disposed on the memory cells MC. The recessed portions 296 are disposed between the dummy features DF or/and the memory cells MC. The recessed portion 298 is disposed out of the outermost dummy feature DF. The upper portions 292, the upper portions 294, the recessed portions 296, and the recessed portion 298 may include substantially the same thickness. The upper surface S2 of the gate electrode layer 290 may conform to that of the resulting structure of FIG. 2F, such that projections of the upper portions 292 of the gate electrode layer 290 on the substrate 210 have a profile similar to the closed graphs of the dummy features DF shown in FIG. 2F, and the gate electrode layer 290 may form at least one recess R1 therein.

Figure 2I:
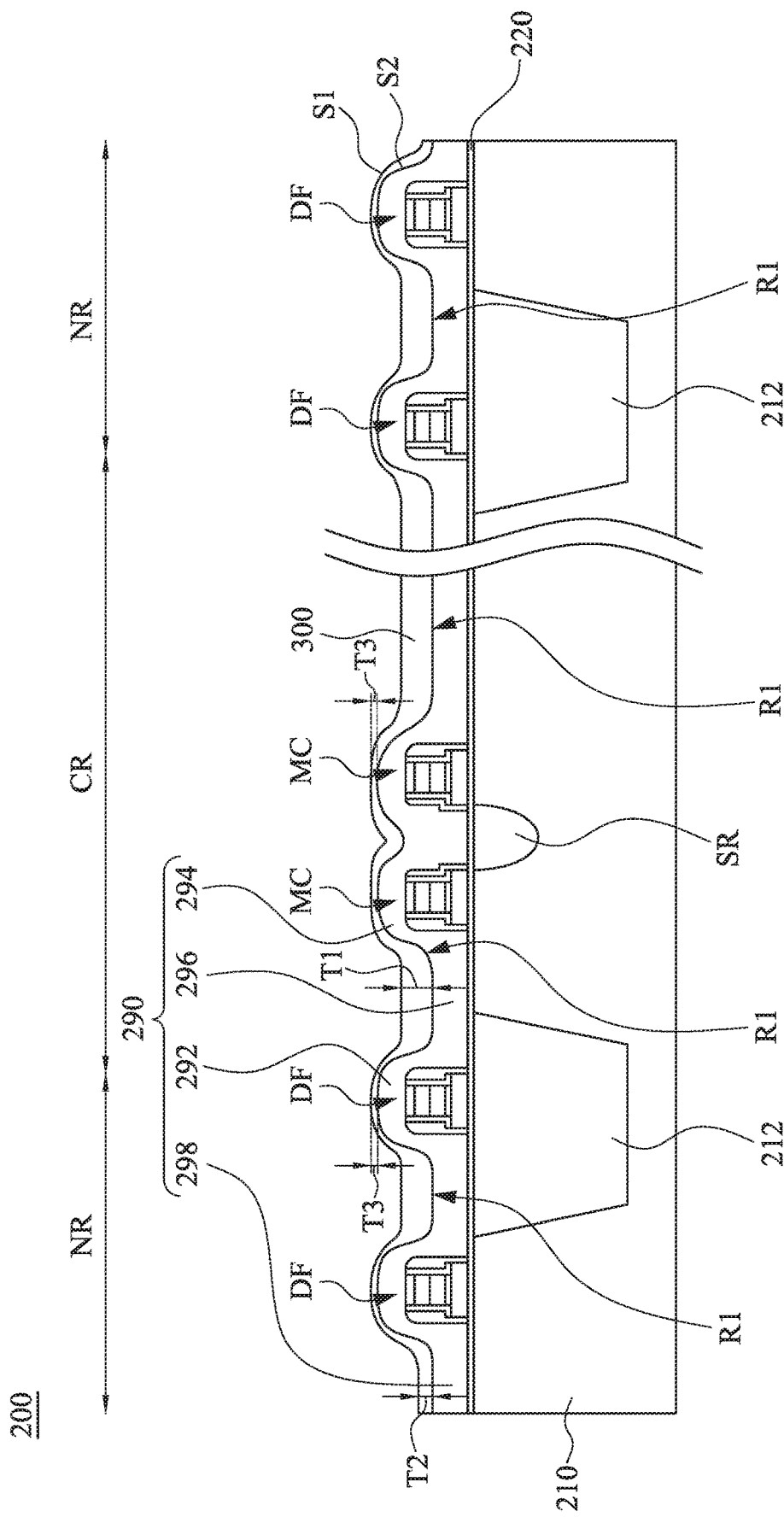

Referring to FIG. 1 and FIG. 2I, the method 100 proceeds to step 108 by applying a flowable material 300 on the gate electrode layer 290.

In the absence of the dummy features DF, the gate electrode layer 290 in the non-cell region NR may be flat, and the flowable material 300 applied thereon may flow away from the substrate 210 (for example, away from the cell region CR), such that the flowable material 300 coated on the gate electrode layer 290 may be too thin on the recessed portions 296. The thin flowable material 300 provides little protection against the subsequent etching processes.

In some embodiments, the dummy features DF surrounding the memory cells MC limit the flow of the flowable material 300. On one hand, the flowable material 300 applied on the gate electrode layer 290 is at least partially confined in the recesses R1 by the upper portions 292. On the other hand, the configuration of the dummy features DF increases the contact area between the flowable material 300 and the gate electrode layer 290, and therefore an adhesion force therebetween is enhanced and can reduce the flow rate of the flowable material 300. Therefore, the flowable material 300 is prevented from flowing away from the cell region CR. Through the configuration, the flowable material 300 on the recessed portions 296 is thickened. For example, as shown in FIG. 2I, the flowable material 300 on the recessed portions 296 has a thicker thickness T1 than a thickness T2 of the flowable material 300 on the recessed portion 298, which is out of the outermost dummy feature DF in the non-cell region NR.

In addition, with the influence of gravity, the thickness of the flowable material 300 changes gradually based on the variation of the heights of the gate electrode layer 290. To be specific, the flowable material 300 may have a thickness T3 on the upper portions 292 and 294 of the gate electrode layer 290, and the thickness T1 on the recessed portions 296 of the gate electrode layer 290 is thicker than the thickness T3. Due to the variation of the thickness of the flowable material 300, the upper surface S1 of the flowable material 300 is more uniform than the upper surface S2 of the gate electrode layer 290. That is, the upper surface S1 of the semiconductor structure 200 in FIG. 2I is more uniform than the upper surface S2 of the semiconductor structure 200 in FIG. 2H.

In some embodiments, the flowable material 300 has a low viscosity in a range from 1 micron pascal-second to 300 pascal-seconds. In some embodiments, the flowable material 300 is bottom anti-reflective coating (BARC), which includes inorganic or organic material. In some embodiments, the flowable material 300 includes organic material that is photocurable. For example, the flowable material 300 may be a photoresist. Alternatively, in some embodiments, the flowable material 300 may be other removable materials. The flowable material 300 may be formed using appropriate spin-on techniques.

Figure 2J:
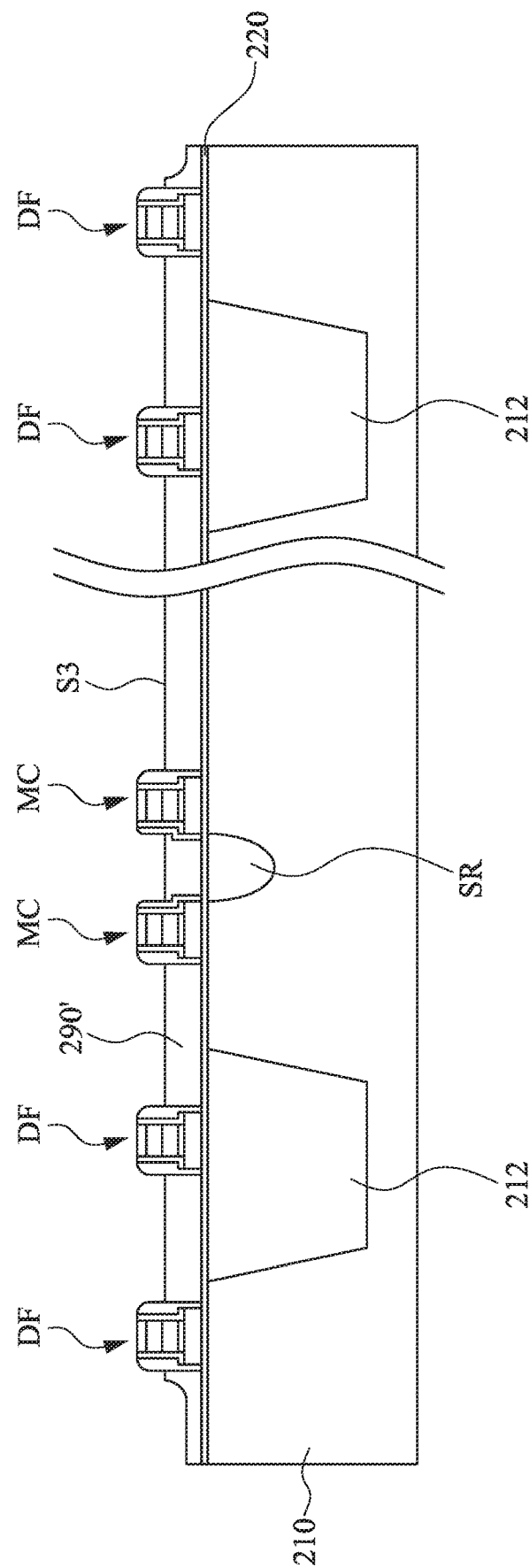

Referring to FIG. 1, FIG. 2I, and FIG. 2J, the method 100 proceeds to step 110 by removing the flowable material 300 and at least a portion of the gate electrode layer 290 above the memory cells MC and the dummy features DF.

Herein, an etching back process is performed. The etching back process may be performed without masking the regions between the dummy features DF or/and the memory cells MC. The etching back process reduces the height of the upper surface S1 of the semiconductor structure 200, and may stop when the top surfaces of the memory cells MC are exposed. Due to the protection of the flowable material 300 with varying thickness, the etching back process can remove the flowable material 300, the upper portions 292, and the upper portions 294 while leaving at least portions of the recessed portions 296 and the recessed portions 298 of the gate electrode layer 290. Therefore, as shown in FIG. 2J, the remaining gate electrode layer 290' is left.

In other words, since the configuration of the dummy features DF thickens the flowable material 300 above the recessed portions 296 and makes the upper surface of the semiconductor structure 200 become more uniform (e. g. the surface S1 is more uniform than the surface S2), the remaining gate electrode layer 290' may be thickened and has a uniform upper surface S3 as well.

Herein, the thickness of the remaining gate electrode layer 290' may relate to etching rates of the gate electrode layer 290 and the flowable material 300 and a difference between the thickness T3 and the thickness T1 of the flowable material 300. In some embodiments, the resulting upper surface S3 of the remaining gate electrode layer 290' is adjusted below the top surfaces of the memory cells MC and the dummy features DF. Alternatively, though it is not shown, in some embodiments, the resulting upper surface S3 of the remaining gate electrode layer 290' may be substantially level with the upper surfaces of the memory cells MC and the dummy features DF.

Figure 2K:
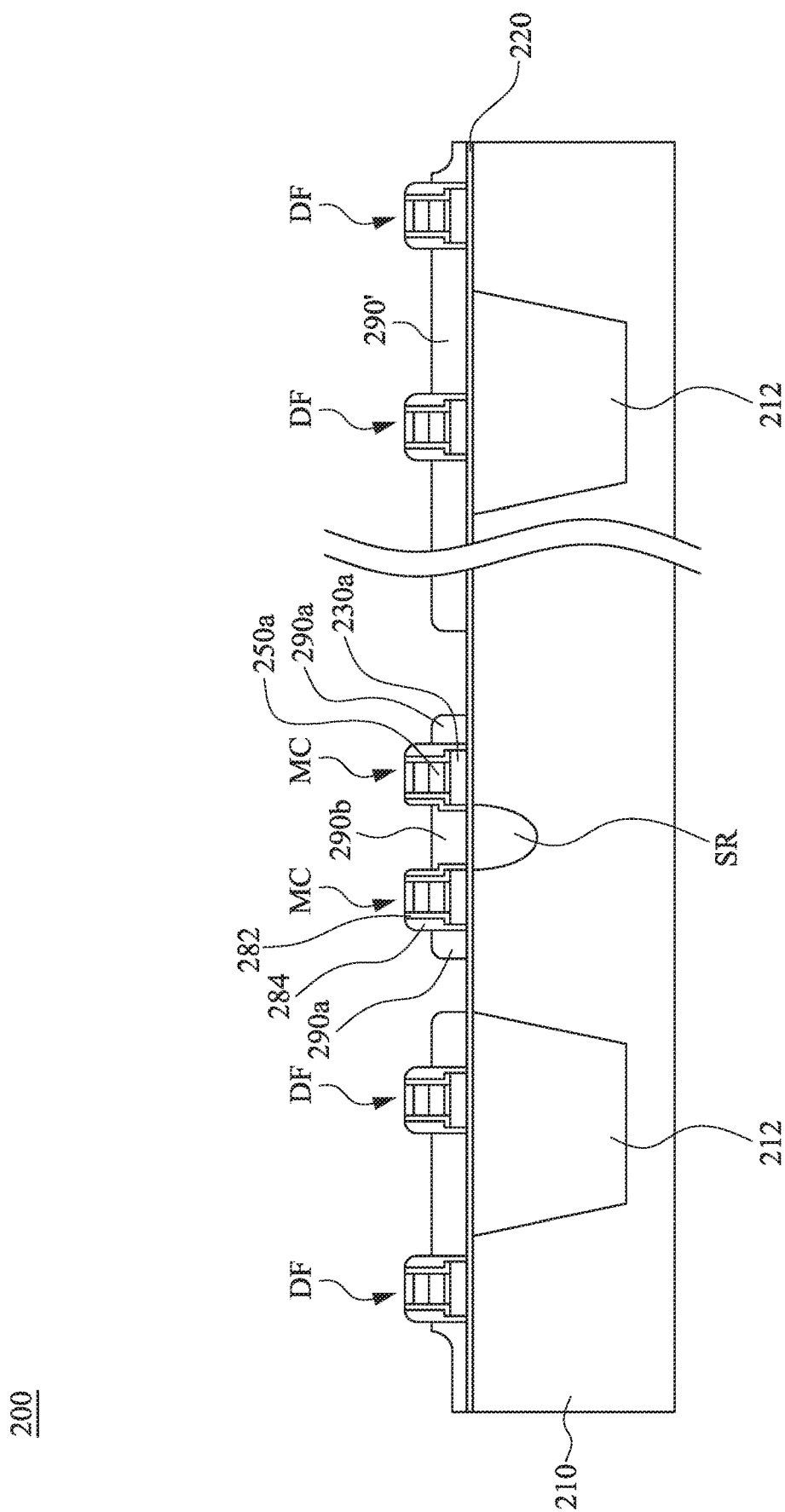

Referring to FIG. 1, FIG. 2J and FIG. 2K, the method 100 proceeds to step 108 by patterning the remaining gate electrode layer 290' to form word lines 290a and an erase gate 290b. As shown in FIG. 2K, at least one of the word lines 290a is formed adjacent to the floating gate layer 230a and the control gate layer 250a of one of the memory cells MC, and the erase gate 290b is formed between at least one pair of the memory cells MC and adjacent to the floating gate layers 230a and the control gate layers 250a of the pair of the memory cells MC. Through the configuration of the dummy features DF, since the remaining gate electrode layer 290' (referring to FIG. 2J) is thickened and has the uniform upper surface S3 (referring to FIG. 2J) as illustrated previously, the substrate 210 is prevented from being over-etched during patterning the remaining gate electrode layer 290'.

Herein, the remaining gate electrode layer 290' adjacent to the dummy features DF is not removed. In some embodiments, the remaining gate electrode layer 290' adjacent to the dummy features DF may be removed during the formation of the word lines 290a.

Figure 2L:
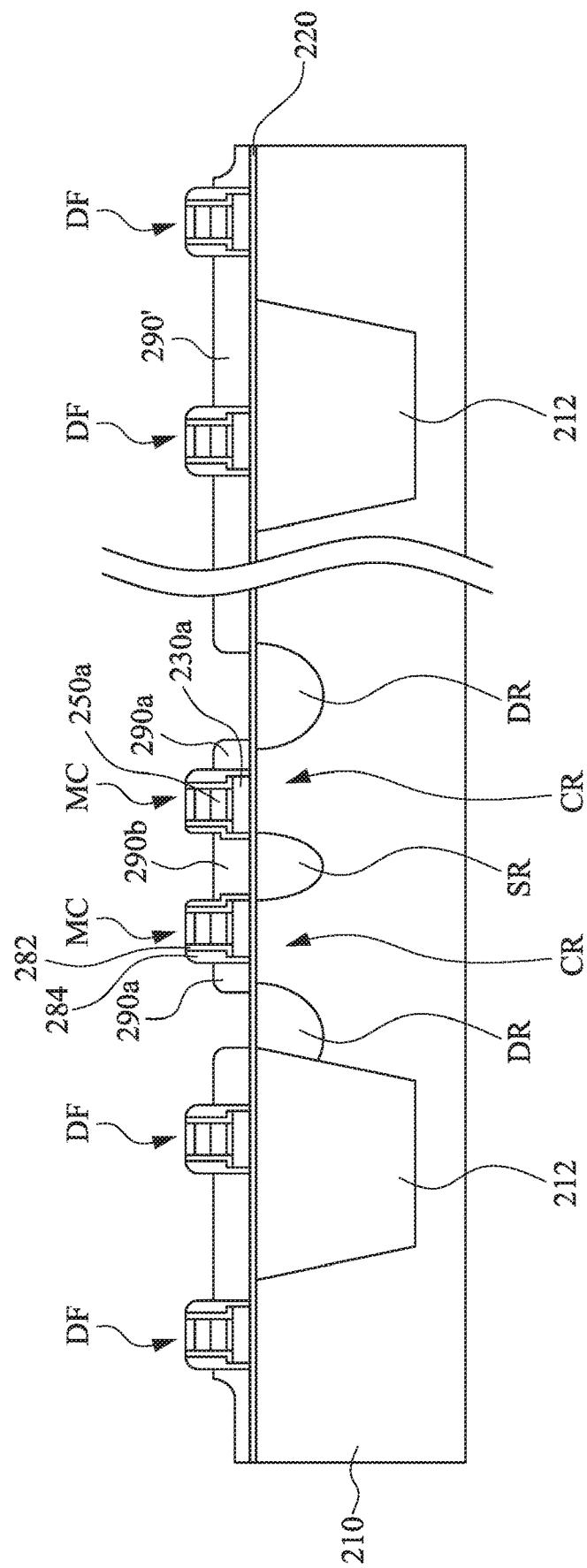

Referring to FIG. 1 and FIG. 2L, after the formation of the word lines 290a and the erase gate 290b, drain regions DR may be formed in the substrate 210 adjacent to the memory cells MC. The drain regions DR may be formed by one or more ion implantation processes. Alternatively, the drain regions DR may be portions of an epitaxy layer. The drain regions DR may diffuse and extend beneath the edge portions of the word lines 290a respectively, and are shared with the word lines of another pair of the memory cells (not shown).

The semiconductor structure 200 are formed with the plural memory cells MC, and each of the memory cells MC can be erased, programmed, and read by applying various voltages to the various portions for said memory cell MC (i.e. the word line 290a, the erase gate 290b, the drain regions DR, the source region SR, and the control gate layer 250a associated with said memory cell MC). Herein, the operations of a selected one of the memory cells MC are briefly illustrated herein.

In some embodiments of the present disclosure, a programming operation (also referred to as a writing operation) takes place in a channel region CR between the word line 290a and the floating gate layer 230a of the selected memory cell MC through efficient hot-electron injection. The word lines 290a are also referred to as selection gates, which is capable of turning on or off the portion of the channel region CR under the word lines 290a. During the programming operation of the selected memory cell MC, the channel region CR under the word line 290a is turned on, a medium voltage may be applied to the source region SR to generate the hot electrons, and control gate layer 250a may be biased to a high voltage. Through the configuration, electrons flow from the source region SR into the channel region CR, then hop up from the channel region CR and are stored in the floating gate layer 230a.

During an erasing operation of the selected memory cell MC, an electric field between the floating gate layer 230a and the erasing gate 290b are built such that electrons in the floating gate layer 230a move to the erasing gate 290b. In some examples, in the operation of the selected memory cell MC, the control gate layer 250a is either grounded or negatively biased, the erase gate 290b is biased positively, and the word line 290a and the drain region DR may be floating. Since a combination of the first sidewall spacer 282 and the second sidewall spacer 284 between the floating gate layer 230a of the selected memory cell MC and the erase gate 290b is thinner than a combination of the first sidewall spacer 282 and the second sidewall spacer 284 between the control gate layer 250a of the selected memory cell MC and the erase gate 290b, charges may be erased from the floating gate layer 230a to the erase gate 290b.

During a read operation, a voltage is applied on the word line 290a of the selected memory cell MC to turn on the portion of the channel region CR under the word line 290a. If the floating gate layer 230a of the selected memory cell MC is programmed with electrons, the portion of the channel region CR under the floating gate layer 230a will not conduct or provide little conduction. If the floating gate layer 230a of the selected memory cell MC is not programmed with electrons (in an erased state), the channel region CR under the floating gate layer 230a will be conductive. The conductivity of the channel region CR is sensed to determine if the floating gate layer 230a is programmed with electrons or not.

Herein, the memory cells MC and the dummy features DF are formed through substantially the same steps, and the stack layers of the memory cells MC may be substantially the same as that of the dummy features DF. One skilled in the art will realize that the teaching also applies to other semiconductor structures.

Figure 3A:
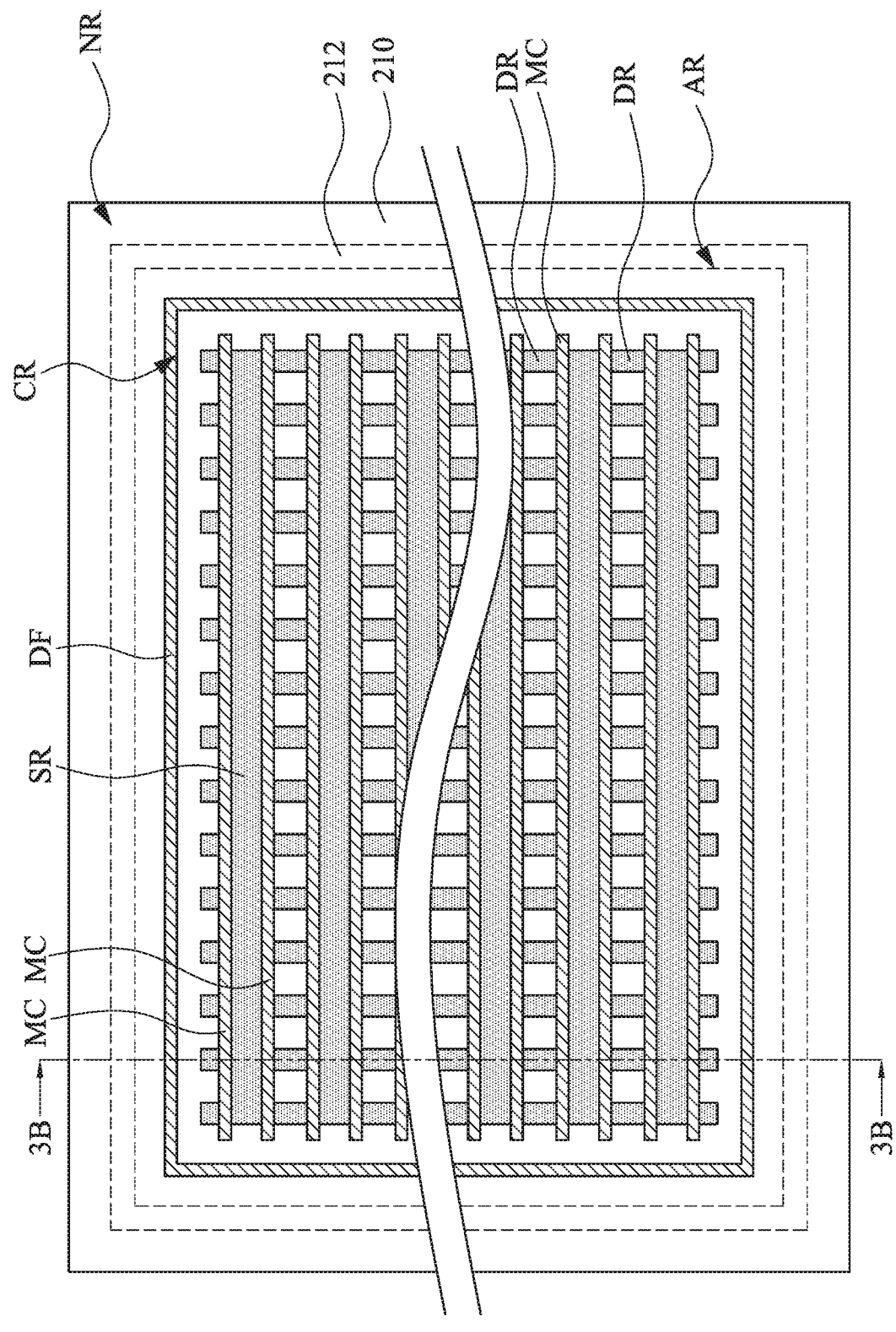
FIG. 3A is a top view of a semiconductor structure according to some embodiments of the present disclosure.
Figure 3B:
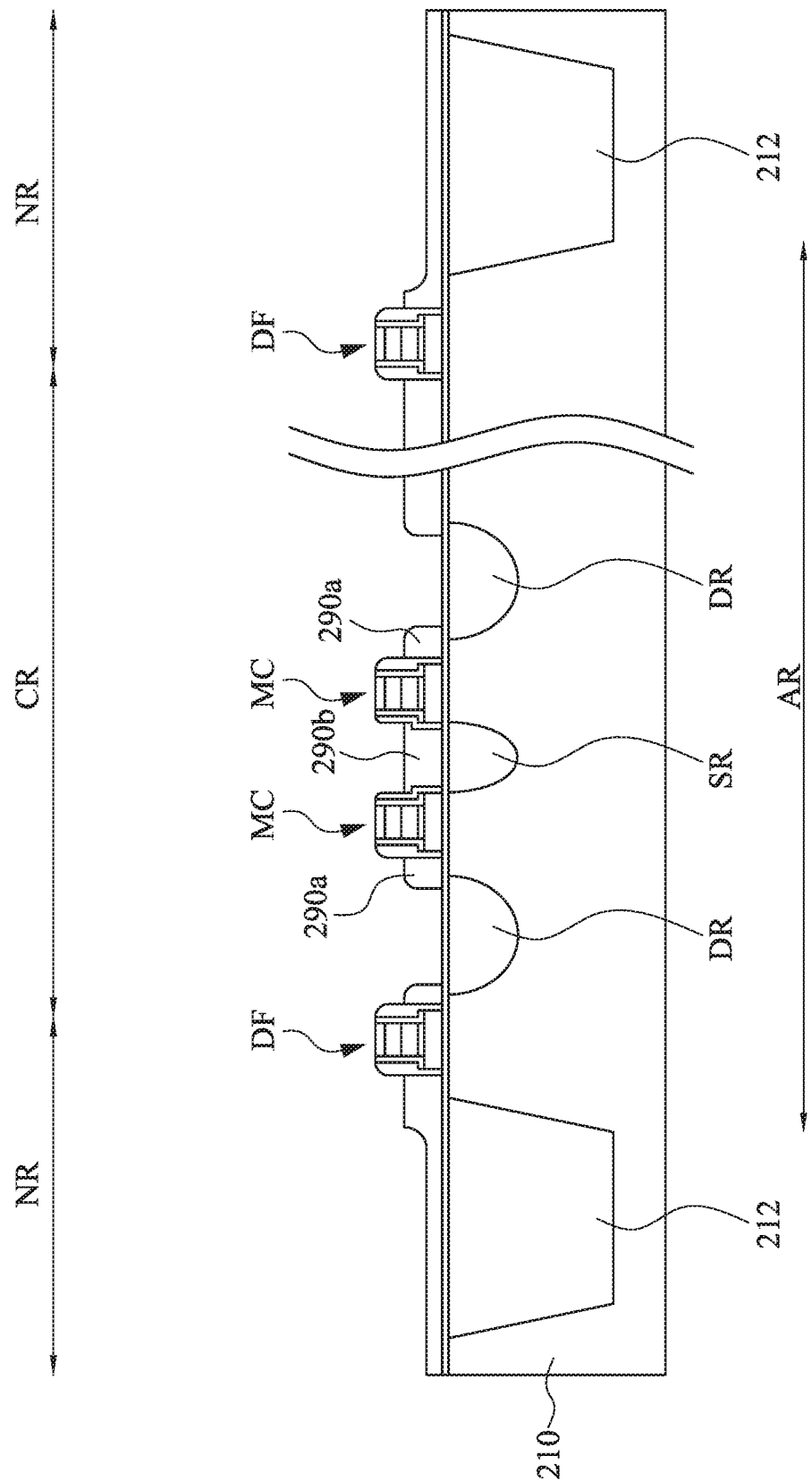
FIG. 3B is a cross-sectional view taken along line 3B-3B of FIG. 3A.

FIG. 3A is a top view of a semiconductor structure 200 according to some embodiments of the present disclosure. FIG. 3B is a cross-sectional view taken along line 3B-3B of FIG. 3A. The semiconductor structure 200 of FIGS. 3A and 3B is similar to the semiconductor structure 200 of FIG. 2L, and the difference between the semiconductor structure 200 of FIGS. 3A and 3B and the semiconductor structure 200 of FIG. 2L includes: the dummy feature DF is disposed on the active region AR defined by the isolation structure 212. Herein, the cell region CR has an area smaller than that of the active region AR.

As illustrated previously, the dummy feature DF surrounds the memory cells MC, and therefore the dummy feature DF confines the flowable material (referring to the flowable material 300 in FIG. 2I) to stay in the cell region CR. Through the configuration, during the formation of the word lines 290a and the erase gate 290b, the substrate 210 is prevented from being over-etched. Other details of the embodiments of FIGS. 3A and 3B are similar to that of the embodiments of FIG. 2L, and therefore not repeated herein.

Figure 4:
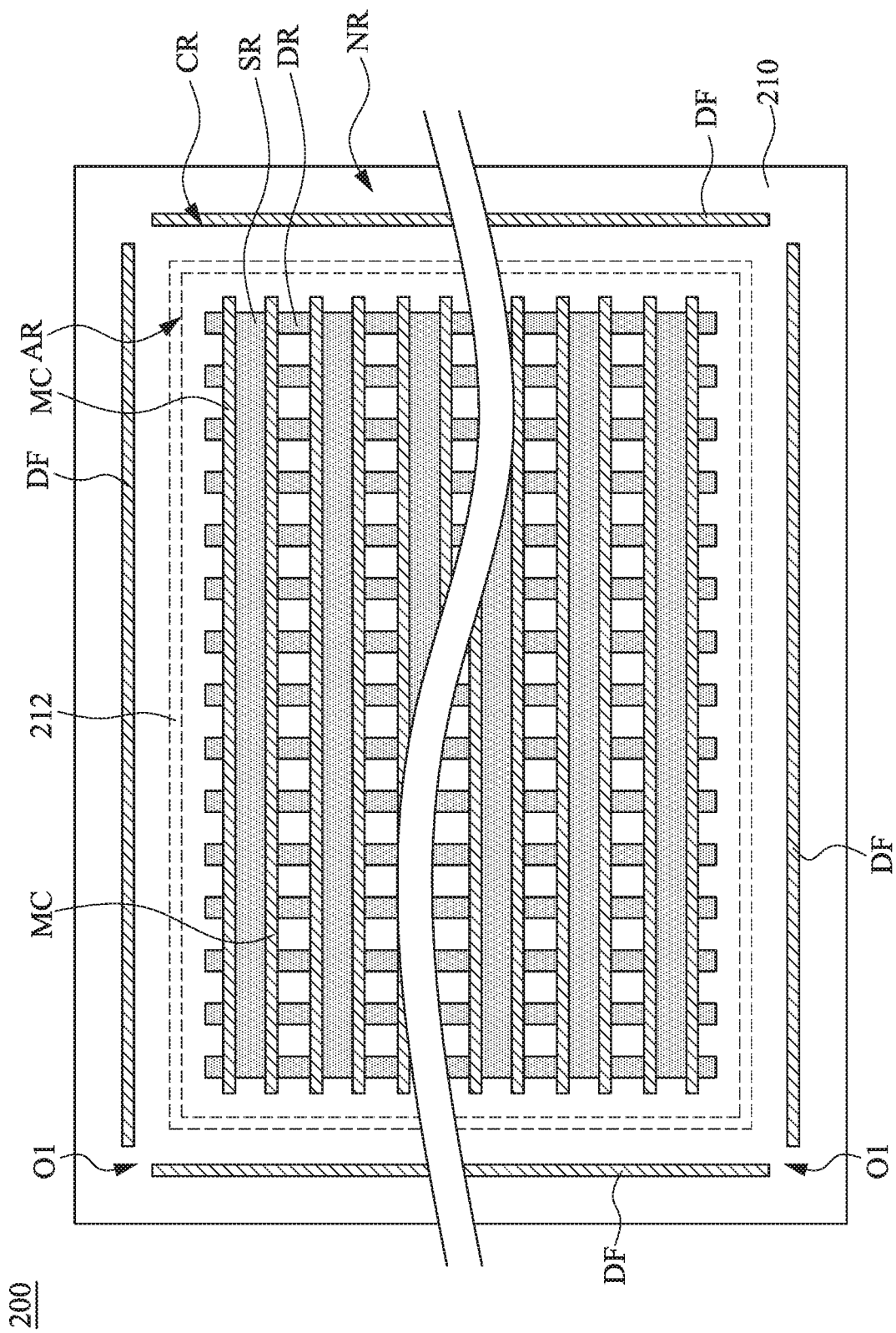
FIG. 4 is a top view of a semiconductor structure according to some embodiments of the present disclosure.

FIG. 4 is a top view of a semiconductor structure 200 according to some embodiments of the present disclosure. The semiconductor structure 200 of FIG. 4 is similar to the semiconductor structure 200 of FIG. 2L, and the difference between the semiconductor structure 200 of FIG. 4 and the semiconductor structure 200 of FIG. 2L includes: the dummy features DF has at least one opening O1 connecting the cell region CR and the non-cell region NR. Furthermore, in the FIG. 4, the dummy features DF are out of the active region AR and away from the isolation structure 212. That is, the cell region CR has an area greater than that of the active region AR.

In some embodiments, the dummy features DF partially surround the memory cells MC. Though the configuration, the substrate 210 is prevented from being over-etched in the patterning process (the formation of the word line and the erase gate). Other details of the embodiments of FIG. 4 are similar to that of the embodiments of FIG. 2L, and therefore not repeated herein.

In various embodiments of the present disclosure, through the configuration of dummy features, the flowable material is confined and prevented from flowing away from the substrate even if the flowable material has low viscosity, such that the substrate is prevented from being over-etched in the subsequent patterning process. Furthermore, in some embodiments of the present disclosure, the structure of the dummy feature is substantially the same as the structure of the memory cell, and therefore no additional steps are taken for the forming the dummy feature. The fabrication process of the dummy feature is well integrated with the fabrication process of the memory cell.

According to some embodiments of the present disclosure, a semiconductor structure includes a semiconductor substrate, at least one raised dummy feature, at least one memory cell, and at least one word line. The raised dummy feature is present on the semiconductor substrate, and defines a cell region on the semiconductor substrate. The memory cell is present on the cell region. The word line is present adjacent to the memory cell.

According to some embodiments of the present disclosure, a semiconductor structure includes a semiconductor substrate, at least one memory cell, at least one word line, and at least one raised dummy feature. The semiconductor substrate has a cell region thereon. The memory cell is present on the cell region. The word line is present adjacent to the memory cell. The raised dummy feature is present outside of the cell region, in which the raised dummy feature has a dummy control gate layer therein, the memory cell has a control gate layer therein, and the dummy control gate layer of the raised dummy feature and the control gate layer of the memory cell are made of substantially the same material.

According to some embodiments of the present disclosure, a method for forming a semiconductor structure includes the following steps: forming at least one memory cell and at least one raised dummy feature surrounding the memory cell on a semiconductor substrate; forming a gate electrode layer on the memory cell and the raised dummy feature, in which the gate electrode layer has an upper portion on the raised dummy feature and an inner recessed portion surrounded by the upper portion; and applying a flowable material on the gate electrode layer, in which the flowable material is at least partially confined by the upper portion of the gate electrode layer.

One general aspect of embodiments disclosed herein includes a device including: a memory cell array, the memory cell array including at least one memory cell gate stack, the at least one memory cell gate stack including a first stack of first materials; and a dummy feature, the dummy feature including at least one dummy gate stack that at least partially surrounds the memory cell array, the at least one dummy gate stack including a second stack of the first materials.

Another general aspect of embodiments disclosed herein includes a semiconductor structure, including: a semiconductor substrate; at least one dummy gate stack present on the semiconductor substrate, where the at least one dummy gate stack defines a cell region on the semiconductor substrate; and at least one memory cell present on the cell region and including an active gate stack, the dummy gate stack and active gate stack each including a same stack of layers.

Yet another general aspect of embodiments disclosed herein includes a method for forming a semiconductor structure, the method including: depositing a plurality of gate stack layers on a semiconductor substrate; patterning the plurality of gate stack layers to simultaneously form a dummy gate stack feature defining a memory cell region and a plurality of memory cell gate stacks within the memory cell region; and applying a flowable material on the plurality of memory cell gate stacks and the dummy gate stack feature, where flow of the flowable material is at least partially confined by the dummy gate stack feature.

In one general aspect embodiments disclosed herein include a device including a transistor array, at least one transistor of the transistor array including a gate stack included of a first stack of first materials; and a dam that extends continuously and unbroken along a side of the transistor array when viewed from a top-down view, the dam including a second stack of the first materials.

In another general aspect embodiments disclosed herein include a semiconductor structure, including a semiconductor substrate having a first region thereon, and at least one transistor present on the first region. The at least one transistor includes a first stack of gate layers, and at least one conductive line formed of a first material is present adjacent to the transistor. The structure further includes at least one raised dummy feature extending continuously along at least one side of the first region, where the raised dummy feature includes a dummy conductive line formed of the first material.

In still another general aspect, embodiments disclosed herein include a method for forming a semiconductor structure, the method including depositing a plurality of gate stack layers on a semiconductor substrate, and patterning the plurality of gate stack layers to simultaneously form a plurality of gate stacks within an array region and a dummy gate stack feature extending continuously and unbroken along at least one side of the array region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A device comprising:
a transistor array, the transistor array having a first side extending in a first direction and a second side extending in a second direction perpendicular to the first direction, at least one transistor of the transistor array including a gate stack comprised of a first stack of first materials; and a dam that extends continuously and unbroken in the first direction along the first side of the transistor array when viewed from a top-down view, the dam comprising a second stack of the first materials.

2. The device of claim 1, wherein the gate stack has a first height and the dam has a second height equal to the first height.

3. The device of claim 1, wherein the gate stack includes a tunneling layer, a floating gate atop the tunneling layer, a blocking layer atop the floating gate, a control gate atop the blocking layer and a capping layer atop the control gate.

4. The device of claim 3, further comprising a sidewall spacer along a sidewall of the capping layer, the control gate and the blocking layer and wherein the floating gate extends under the sidewall spacer.

5. The device of claim 1, wherein the dam extends continuously and unbroken along all sides of the transistor array.

6. The device of claim 1, further including a second dam, wherein the second dam at least partially surrounds the dam.

7. The device of claim 6, wherein the second dam includes a third stack of the first materials.

8. The device of claim 7, wherein the transistor array is a memory cell array that is formed in a semiconductor substrate, and further comprising at least one isolation structure present in the semiconductor substrate for defining at least one active region, wherein the memory cell array is present on the active region, and the dam is present outside of the active region.

9. A semiconductor structure, comprising:
a semiconductor substrate having a first region thereon;
at least one transistor present on the first region, the at least one transistor including a first stack of gate layers;
at least one conductive line formed of a first material present adjacent to the transistor, the first material being a different material or a different combination of materials compared to the first stack of gate layers; and
at least one raised dummy feature extending continuously along at least one side of the first region, wherein the raised dummy feature includes a dummy conductive line formed of the first material.

10. The semiconductor structure of claim 9, wherein the first region is a memory cell region.

11. The semiconductor structure of claim 9, wherein the first stack of gate layers includes a tunneling layer, a floating gate atop the tunneling layer, a blocking layer atop the floating gate, a control gate atop the blocking layer and a capping layer atop the control gate.

12. The semiconductor structure of claim 11, further comprising a sidewall spacer along a sidewall of the capping layer, the control gate and the blocking layer and wherein the floating gate extends under the sidewall spacer.

13. The semiconductor structure of claim 9, wherein the at least one raised dummy feature extends across an isolation structure in the semiconductor substrate.

14. The semiconductor structure of claim 9, wherein the first stack of gate layers and the at least one raised dummy feature have the same height.

15. The semiconductor structure of claim 9, wherein the first stack of gate layers has asymmetric sidewalls spacer and further wherein the at least one raised dummy feature has symmetric sidewalls spacers.

16. A method for forming a semiconductor structure, the method comprising:
depositing a plurality of gate stack layers on a semiconductor substrate; and
patterning the plurality of gate stack layers to simultaneously form a plurality of gate stacks within an array region and a dummy gate stack feature extending continuously and unbroken along at least one side of the array region.

17. The method of claim 16, further comprising:
applying a flowable material on the plurality of gate stacks and the dummy gate stack feature, wherein flow of the flowable material is at least partially impeded by the dummy gate stack feature.

18. The method of claim 17, wherein the flowable material is selected from the group consisting of anti-reflective coating and photoresist.

19. The method of claim 17, further comprising etching back the flowable material and removing a portion of the gate stacks.

20. The method of claim 19, further comprising patterning the gate stacks to form word lines and erase gates.

* * * * *